United States Patent
Hsia et al.

(10) Patent No.: US 8,653,542 B2
(45) Date of Patent: Feb. 18, 2014

(54) MICRO-INTERCONNECTS FOR LIGHT-EMITTING DIODES

(75) Inventors: Hsing-Kuo Hsia, Jhubei (TW); Chih-Kuang Yu, Chiayi (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 153 days.

(21) Appl. No.: 13/005,731

(22) Filed: Jan. 13, 2011

(65) Prior Publication Data
US 2012/0181568 A1    Jul. 19, 2012

(51) Int. Cl.
*H01L 29/18* (2006.01)

(52) U.S. Cl.
USPC .................................... 257/88; 257/E33.072

(58) Field of Classification Search
USPC ............... 257/99, E33.056, E33.064; 438/28
See application file for complete search history.

(56) References Cited

U.S. PATENT DOCUMENTS

| | | | | |
|---|---|---|---|---|
| 5,760,861 A * | 6/1998 | Kim | | 349/110 |
| 5,960,311 A * | 9/1999 | Singh et al. | | 438/623 |
| 7,112,901 B1 | 9/2006 | Soitu | | |
| 7,256,483 B2 * | 8/2007 | Epler et al. | | 257/676 |
| 7,462,879 B2 * | 12/2008 | Oohata et al. | | 257/99 |
| 7,632,691 B2 * | 12/2009 | Shum | | 438/22 |
| 7,863,626 B2 * | 1/2011 | Shum | | 257/81 |
| 7,875,533 B2 * | 1/2011 | Epler et al. | | 438/478 |
| 7,973,331 B2 * | 7/2011 | Hsu et al. | | 257/99 |
| 7,977,686 B2 * | 7/2011 | Ibbetson et al. | | 257/88 |
| 8,344,412 B2 * | 1/2013 | Hsu et al. | | 257/99 |
| 2003/0006418 A1 * | 1/2003 | Emerson et al. | | 257/79 |
| 2005/0194606 A1 * | 9/2005 | Oohata | | 257/99 |
| 2006/0240585 A1 * | 10/2006 | Epler et al. | | 438/22 |
| 2007/0108461 A1 * | 5/2007 | Shiraishi et al. | | 257/98 |
| 2007/0145383 A1 * | 6/2007 | Rho et al. | | 257/79 |
| 2007/0284607 A1 * | 12/2007 | Epler et al. | | 257/103 |
| 2008/0035935 A1 * | 2/2008 | Shum | | 257/79 |
| 2008/0142817 A1 * | 6/2008 | Ibbetson et al. | | 257/88 |
| 2008/0169548 A1 | 7/2008 | Baek | | |
| 2009/0272991 A1 * | 11/2009 | Lee et al. | | 257/91 |
| 2009/0273002 A1 * | 11/2009 | Chiou et al. | | 257/99 |
| 2009/0274016 A1 * | 11/2009 | Katsuragawa | | 369/13.35 |
| 2009/0294780 A1 * | 12/2009 | Chou et al. | | 257/88 |
| 2010/0006864 A1 * | 1/2010 | Steigerwald | | 257/99 |
| 2010/0018634 A1 * | 1/2010 | Takahashi et al. | | 156/150 |
| 2010/0163907 A1 * | 7/2010 | Hsu et al. | | 257/98 |
| 2010/0258827 A1 * | 10/2010 | Lee et al. | | 257/98 |
| 2011/0084382 A1 * | 4/2011 | Chen et al. | | 257/737 |
| 2011/0241218 A1 * | 10/2011 | Meyer et al. | | 257/774 |
| 2012/0164768 A1 * | 6/2012 | Lee et al. | | 438/27 |
| 2012/0205694 A1 * | 8/2012 | Chern et al. | | 257/98 |
| 2012/0208319 A1 * | 8/2012 | Meyer et al. | | 438/107 |
| 2012/0235204 A1 * | 9/2012 | Hodota et al. | | 257/98 |

(Continued)

*Primary Examiner* — Vongsavanh Sengdara
(74) *Attorney, Agent, or Firm* — Haynes and Boone, LLP (57) ABSTRACT

The present disclosure provides a method of fabricating a light emitting diode (LED) package. The method includes bonding a plurality of separated light emitting diode (LED) dies to a substrate, wherein each of the plurality of separated LED dies includes an n-doped layer, a quantum well active layer, and a p-doped layer; depositing an isolation layer over the plurality of separated LED dies and the substrate; etching the isolation layer to form a plurality of via openings to expose portions of each LED die and portions of the substrate; forming electrical interconnects over the isolation layer and inside the plurality of via openings to electrically connect between one of the doped layers of each LED die and the substrate; and dicing the plurality of separated LED dies and the substrate into a plurality of LED packages.

18 Claims, 6 Drawing Sheets

(56) References Cited

U.S. PATENT DOCUMENTS

2012/0286240 A1* 11/2012 Yu et al. .................. 257/13
2012/0299176 A9* 11/2012 Lin et al. .................. 257/737
2012/0306100 A1* 12/2012 Chino ...................... 257/774

* cited by examiner

Fig. 8

MICRO-INTERCONNECTS FOR LIGHT-EMITTING DIODES

CROSS REFERENCE

The present disclosure is related to the following commonly-assigned U.S. patent application, the entire disclosure of which is incorporated herein by reference: U.S. Ser. No. 13/025,975, filed Feb. 11, 2011 by inventors Chyi Shyuan Chern et al for "LIGHT EMITTING DIODE EMITTER SUBSTRATE WITH HIGHLY REFLECTIVE METAL BONDING".

BACKGROUND

Light emitting diodes (LEDs) emit light when voltages are applied across a P/N junction. LED devices are widely used in various applications such as indicators, signs, light sources, and other types of lighting. LED devices are fabricated and further packaged for applications. Traditional methods of packaging LEDs include bonding LED dies to package substrates separately, which is not cost-effective and introduce more manufacturing challenges when the LED dices shrink to smaller sizes. For example, electrical connections by wire bond between a LED die and the corresponding package substrate becomes increasingly difficult to apply as the size of the LED die becomes progressively smaller. This limits the use of wire bonding for LED dies with a small form factor. Furthermore, wire bonding of interconnects is a sequential process that requires increased assembly time as the number of bonding wires increases. In addition, the length of the bonding wires may degrade electrical and optical characteristics of the packaged LEDs. Accordingly, there is a need for LED packaging structures and methods that are capable of providing electrical connections for LEDs with a small form factor while reducing manufacturing time and cost.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIGS. 1 through 5 are sectional views of a semiconductor structure 100 having light-emitting diodes (LED) dies at various wafer level packaging stages constructed according to various aspects of the present disclosure in one or more embodiments. FIG. 6 illustrates a sectional view of one embodiment of a LED emitter. With reference to FIGS. 1 through 6, the semiconductor structure 100 and a method of making the same are collectively described.

Figure 1:
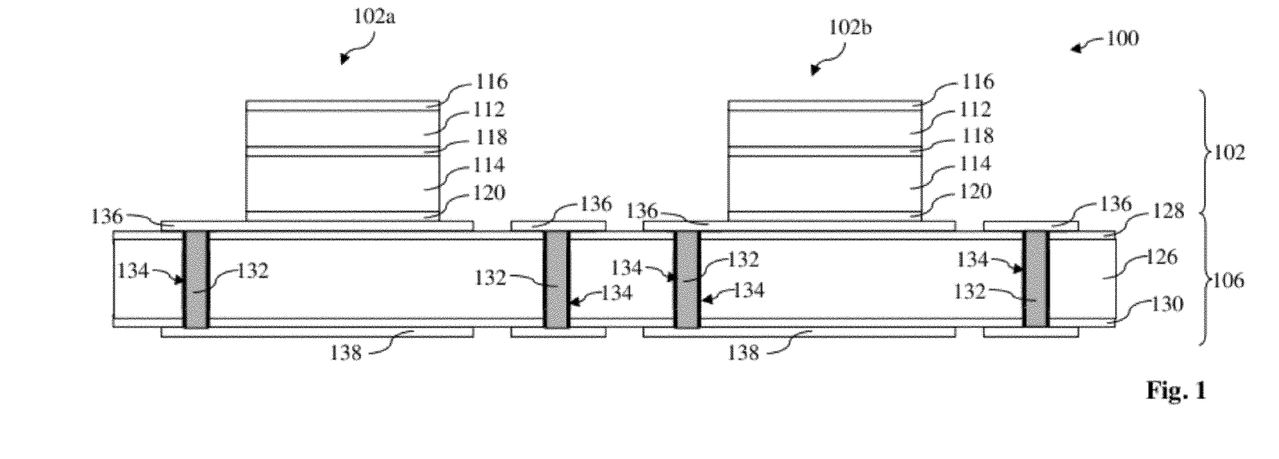
FIGS. 1-5 show cross-sectional views of a semiconductor structure having light-emitting diode (LED) dies at various wafer-level packaging stages constructed according to one or more embodiments of the present disclosure.

Referring to FIG. 1, the semiconductor structure 100 includes a plurality of LED dies 102 bonded to a packaging substrate 106 at wafer level. In the present example, two LED dies 102a and 102b are provided for illustration. Each of the LED dies 102 includes a LED 112 and a carrier substrate 114.

The LED 112 includes an n-type doped semiconductor layer and a p-type doped semiconductor layer configured as a PN junction designed to emit light during operation. In the current embodiment, the LED 112 further includes a multiple quantum well (MQW) sandwiched in the PN junction for tuned characteristics and enhanced performance. Each of the LED dies 102 further includes a top electrode 116 (e.g., an n-contact) and a bottom electrode (e.g., a p-contact) 118 connected to the n-type and the p-type doped semiconductor layers, respectively.

The carrier substrate 114 is adjacent the bottom electrode 118. In one embodiment, the carrier substrate 114 is a heavily doped silicon substrate designed to provide mechanical strength, electrical coupling and a thermal conductive path for the LED dies. The LED dies 102 may further include an additional conductive layer 120 (also referred to as a second p-contact), such as metal, for reduced contact resistance and enhanced bonding effect to the packaging substrate 106 at wafer-level packaging.

The packaging substrate 106 includes a silicon wafer 126. The packaging substrate 106 further includes thin dielectric films 128 and 130 formed on the top and bottom surfaces of the silicon wafer 126, respectively. The thin dielectric films 128 and 130 may include silicon oxide, silicon nitride, silicon oxynitride, silicon carbide, diamond-like carbon or other suitable dielectric material. In the present embodiment, the thin dielectric films 128 and 130 include silicon oxide and are formed by thermal oxidation, chemical vapor deposition (CVD) or other suitable technique.

Various through-silicon vias (TSVs) 132 are formed in the silicon wafer 126 and are configured to provide electrical connection to the electrodes of the LED dies 102. In one embodiment, the TSVs 132 include a conductive material, such as copper or other suitable metal/metal alloy. The TSVs 132 can be formed by a procedure including etching and deposition. The deposition may include physical vapor deposition (PVD), plating, combination, or other suitable technique.

The TSVs 132 may further include a thin dielectric material layer 134 formed on the sidewalls of the vias to separate the TSVs 132 from the silicon wafer 126 for electrical isolation. The thin dielectric material layer 134 may include silicon oxide, silicon nitride, silicon oxynitride, silicon carbide, diamond-like carbon or other suitable dielectric material. In the present embodiment, the thin dielectric material layer 134 includes silicon oxide and is formed by thermal oxidation, CVD or other suitable technique.

In another embodiment, the silicon wafer 126 is etched to form trenches/vias; the thin dielectric material layer 134 is formed on the sidewalls of the trenches/vias; a copper seed layer is formed on the thin dielectric material layer 134; and then a plating process is performed to form the TSVs 132. In another embodiment, the thin dielectric films 128/130 and the thin dielectric material layer 134 include similar material and are formed simultaneously by a same process, such as thermal oxidation or CVD.

The packaging substrate 106 further includes various metal features 136 and 138 positioned on the top surface and the bottom surface of the silicon wafer 126. The metal features 136 and 138 are deposited on the thin dielectric films 128 and 130 respectively. The metal features 136 and 138 are designed to couple together through one of the TSVs 132. The metal features 138 function as electrodes of the LED dies 102 at the packaging level. Particularly, the bottom electrode 118 is electrically coupled to the corresponding metal feature 138 through the conductive layer 120 and one of the metal features 136 and one of the TSVs 132.

The LED dies 102 are bonded to the silicon wafer 126 through the conductive layer 120 and a subset of the metal features 136. Therefore, the subset of the metal features 136 is also referred to as bonding contacts on the packaging substrate. The conductive layer 120 and the metal features 136 are properly chosen to enable eutectic bonding or other suitable bonding mechanism. In various embodiments, the metal features 136 and 138 include metal or metal alloy with good conductive properties, both electrical and thermal, and good bonding property such as gold, gold alloy, copper, copper alloy, nickel, nickel alloy, platinum, platinum alloy, titanium, titanium alloy, or combinations thereof.

In another embodiment, the metal features 136 and 138 are formed simultaneously with the TSVs 132 in the same procedure. For example, the silicon wafer 126 is etched to form trenches/vias; a thin dielectric material layer is formed on the sidewalls of the trenches/vias and the surfaces of the silicon wafer 126, resulting the thin dielectric material layer 134 and the thin dielectric films 128 and 130; then a copper seed layer is formed on the sidewalls of the trenches/vias and the surfaces of the silicon wafer 126 by PVD; a patterned photoresist layer is formed on to defined the regions for the metal features 136 and 138; and a copper plating process is implemented to form TSVs 132 and the metal features 136 and 138. The patterned photoresist layer is removed thereafter.

Figure 2:
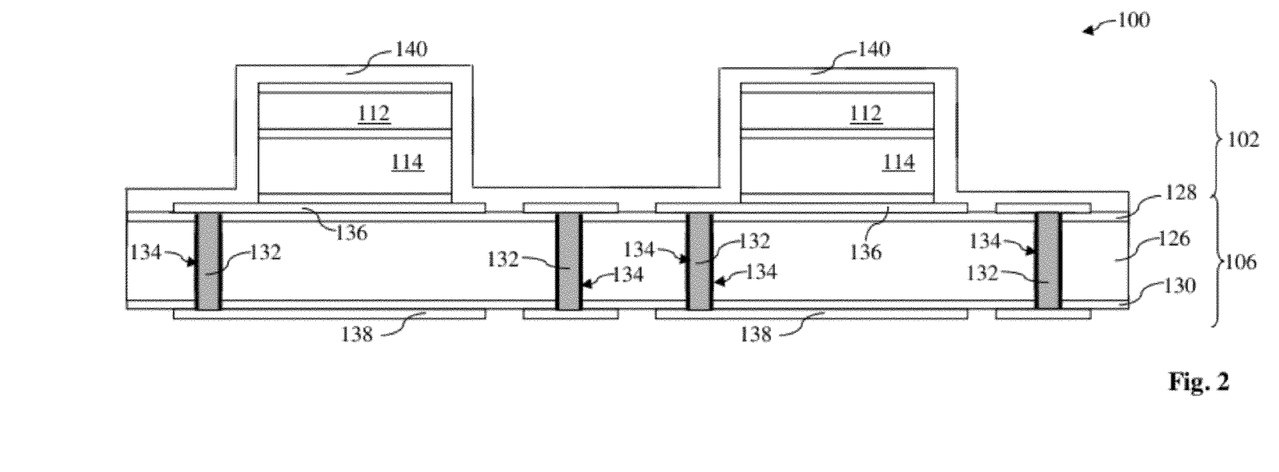

Referring to FIG. 2, an isolation layer 140 is deposited over the LED dies 102 and the packaging substrate 106. Particularly, the isolation layer 140 covers the top electrode 116 of the LED dies 102 and the metal features 136 of the packaging substrate 106 for isolation and passivation. In one embodiment, the isolation layer 140 is conformal and has a uniform thickness. In another embodiment, the isolation layer 140 includes silicon oxide, aluminum oxide, or other suitable dielectric material (such as a dielectric material transparent to the light emitted by the LED device 112) formed by CVD or other technique.

Figure 3:
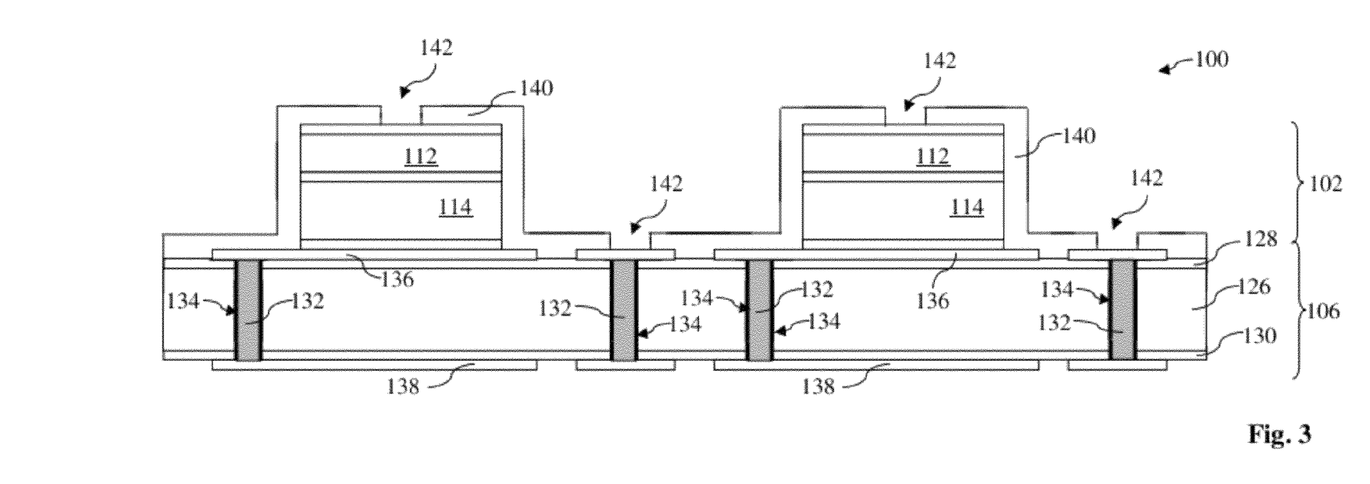

Referring to FIG. 3, the isolation layer 140 is patterned to form various via openings (or openings) 142 that expose the top electrode 116 and the metal features 136 for electrical routing. In one embodiment, the patterning of the isolation layer 140 includes a lithography process and etching. The isolation layer 140 is patterned using lithographic and etching processes of any suitable methods. For example, one method includes patterning the surface of the isolation layer 140 with a sequential process including photoresist patterning, etching, and photoresist stripping. In furtherance of the example, the photoresist patterning includes processing steps of photoresist coating, soft baking, exposing pattern, post-exposure baking, developing photoresist, and hard baking. The etching process may include dry etching, such as fluorine-containing plasma etching. Alternatively, the etching process includes wet etching, such as a hydrofluoride (HF) solution if the isolation layer 140 is a silicon oxide material. In an alternative embodiment, the lithography patterning may be implemented or replaced by other proper methods such as maskless photolithography, electron-beam writing, ion-beam writing, and molecular imprint.

Figure 4:
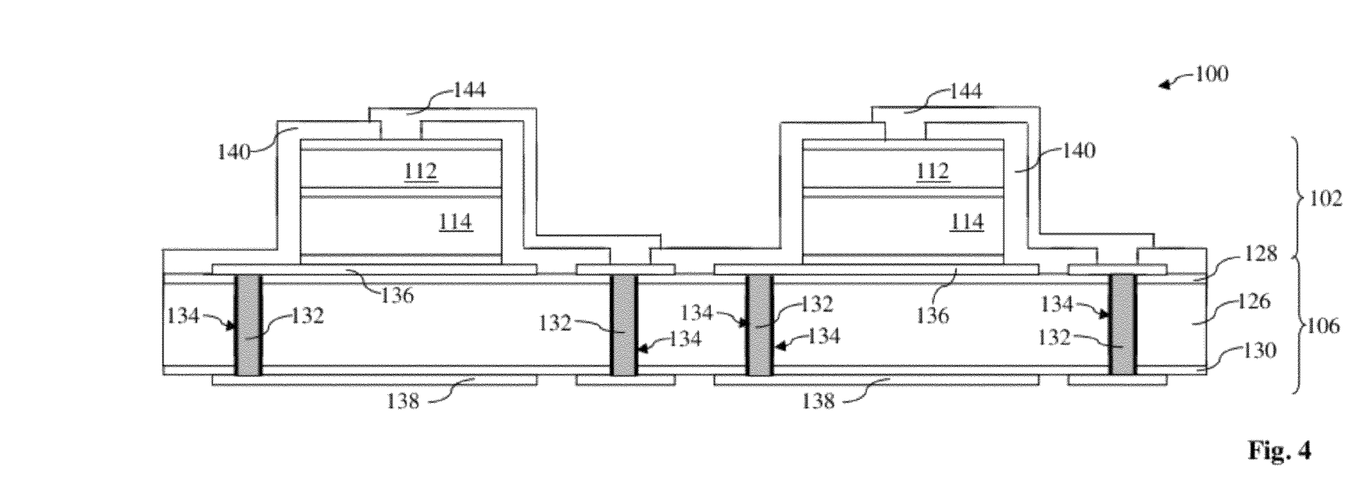

Referring to FIG. 4, an interconnect features 144 are formed on the isolation layer 140 and in the opening 142 to contact the top electrode 116 and the metal features 136. The interconnect features 144 couple the top electrode 116 to the corresponding metal feature 138 through the respective metal feature 136 and the TSV 132. The interconnect features 144 provides conductive routing from the electrodes of the LED dies 102 to the metal features 138 on the packaging substrate, therefore also referred to as the re-distribution lines (RDLs) or micro-interconnects. Thus, the various metal features 138 serve as electrodes at packaging level. The interconnect features 144 may be a metal layer or a transparent conductive layer such as indium tin oxide (ITO) or indium zinc oxide (IZnO). In the process to form the interconnect features 144, a barrier layer such as titanium and a seed metal layer such as copper can be deposited on the isolation layer 140. A photoresist layer will be laminated on the seed metal layer and patterned in a lithography process followed by etching the seed layer through the patterned photoresist layer and metal plating to define the re-distribution lines for the micro-interconnects. The metal features 144 may cover the isolation layer to a uniform thickness.

Figure 5:
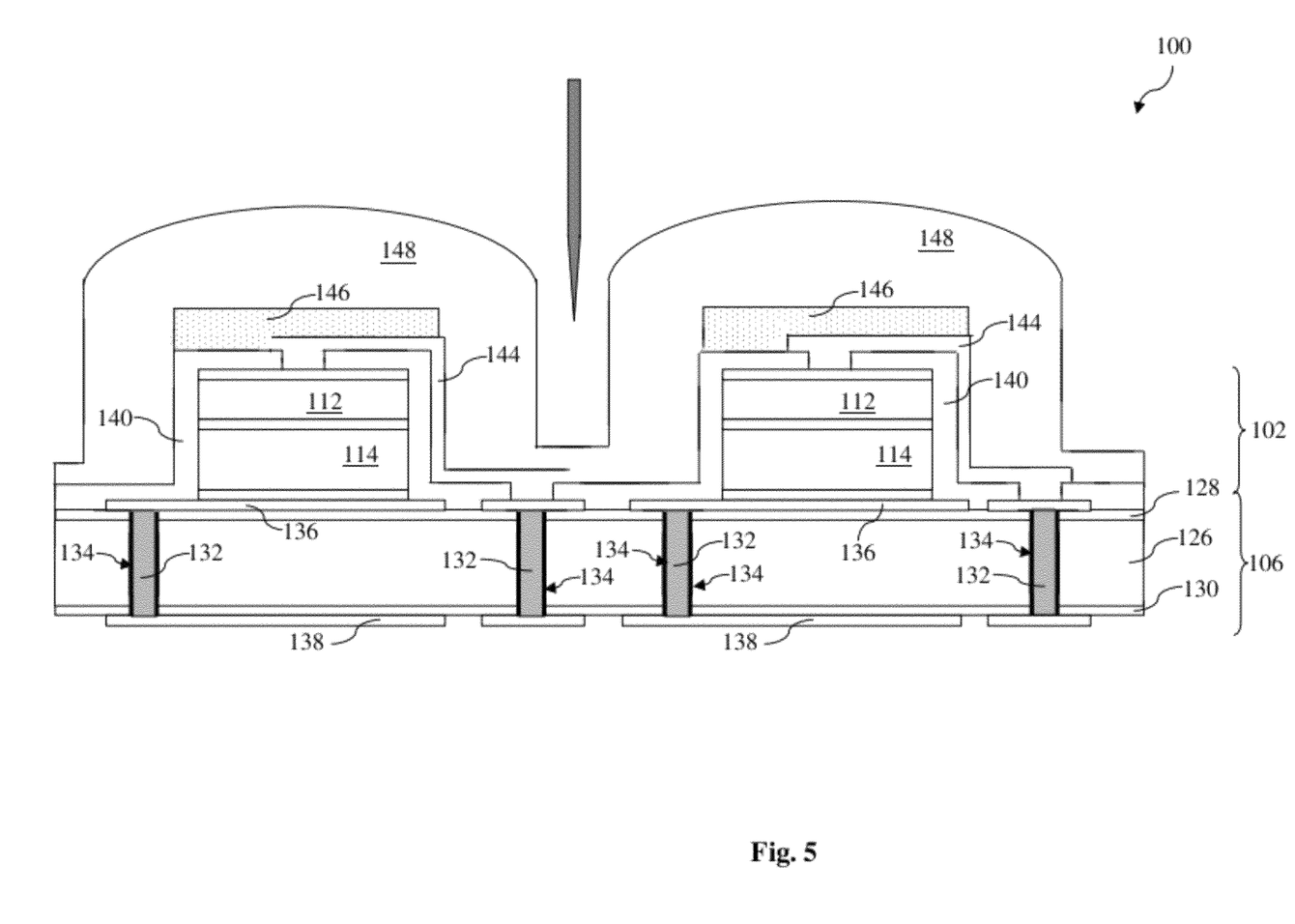
Figure 6:
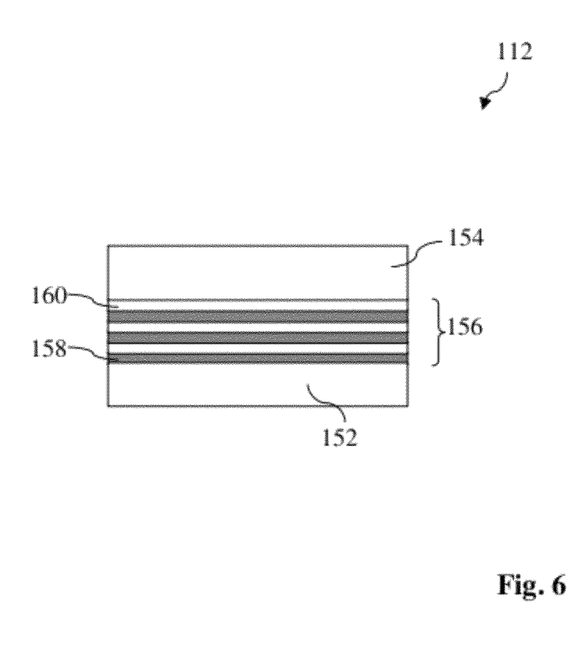
FIG. 6 shows a cross-sectional view of a LED incorporated in the semiconductor structure of FIGS. 1-5 according to one or more embodiments of the present disclosure.

Referring to FIG. 5, a phosphor 146 is distributed around the LED dies 102 to change the wavelength of the emitted light. In one embodiment, the phosphor embedded in a coating material is formed on the interconnect features 144 and the isolation layer 140. Phosphor coating may be deposited using a mask or through screen printing to form a surface phosphor layer to only cover the interconnect features 144 and the isolation layer 140 on the top surface of the LED dies 102. Alternatively, phosphor coating may be deposited through a spray process to form a conformal phosphor layer to cover the interconnect features and the isolation layer on the top surface and also the side walls of the LED dies to a uniform thickness.

Still referring to FIG. 5, a lens 148 is formed on the phosphor coating to further shape an emission pattern of the emitted light with enhanced light emission efficiency. In one embodiment, the lens 148 includes epoxy, silicone or other suitable material. In one example, the lens may be formed by placing a lens molding over the LED die, injecting silicone into the lens molding, and curing the injected silicone.

The LED dies along with silicon substrate are diced into individual LED packages to complete the wafer level packaging process. The separated LED packages include individual LED dies 102 bonded with the diced packaging substrate 106.

FIG. 6 illustrates a sectional view of the LED 112 packaged in the semiconductor structure 100 according to one embodiment of the present embodiment. The LED 112 includes a p-type doped semiconductor layer 152 and an n-type doped semiconductor layer 154 configured as a PN junction designed to emit light during operation. In one embodiment, the p-type and n-type doped semiconductor layers 152 and 154 includes respectively doped gallium nitride (GaN) layers.

The LED 112 further includes a multiple quantum well (MQW) 156 interposed between the n-type and p-type doped semiconductor layers for tuned LED characteristic and enhanced performance. The MQW 156 includes a stack of two alternating semiconductor material films 158 and 160. In one example, the two semiconductor material films 158 and 160 include an indium gallium nitride (InGaN) and gallium nitride (GaN), respectively. Various semiconductor layers can be grown by proper epitaxy growth technique. In one example, the epitaxial semiconductor layers are deposited by metal organic chemical vapor deposition (MOCVD).

One embodiment of forming the LED dies 102 is also provided below and is referred to as a v-flow. In the v-flow, the LED 112 is formed on a growth substrate, such as sapphire. Alternative growth substrates include silicon carbide, silicon, or other materials. The LED 112 includes various epitaxial semiconductor layers deposited on the growth substrate by processes such as MOCVD or other deposition processes. The deposited epitaxial layers may include an un-doped GaN layer (un-GaN), an n-doped GaN layer (n-GaN), a multiple quantum well (MQW) active layer, and a p-doped GaN layer (p-GaN).

LEDs may have different configurations and different processing steps based on how the epitaxial layers are electrically accessed. In the present embodiment, contact metallization for the p-GaN and n-GaN layers are disposed on opposite sides of the LEDs. The corresponding LED dies are referred to as vertical dies. In addition, the growth substrate is normally removed before the LEDs are diced into separated dies. To prepare the LEDs for dicing, a heavily doped silicon substrate is disposed on the p-contact metal layer to serve as the carrier substrate 114. The conductive layer (second p-contact metal layer) 120 may then be deposited on the heavily doped silicon layer followed by the removal of the growth substrate. For a sapphire growth substrate, the growth substrate removal may be by means of a laser lift-off (LLO) technique. For a silicon-based growth substrate, removal may be by means of dry or wet etching techniques. Similarly, the un-GaN layer is removed. Removal of the growth substrate and the un-GaN layer exposes the n-GaN layer. The top electrode (n-contact metal layer) 116 is then deposited on the exposed n-GaN layer. The LEDs and the heavily doped silicon layer are diced into separated LED dies 102.

Figure 7:
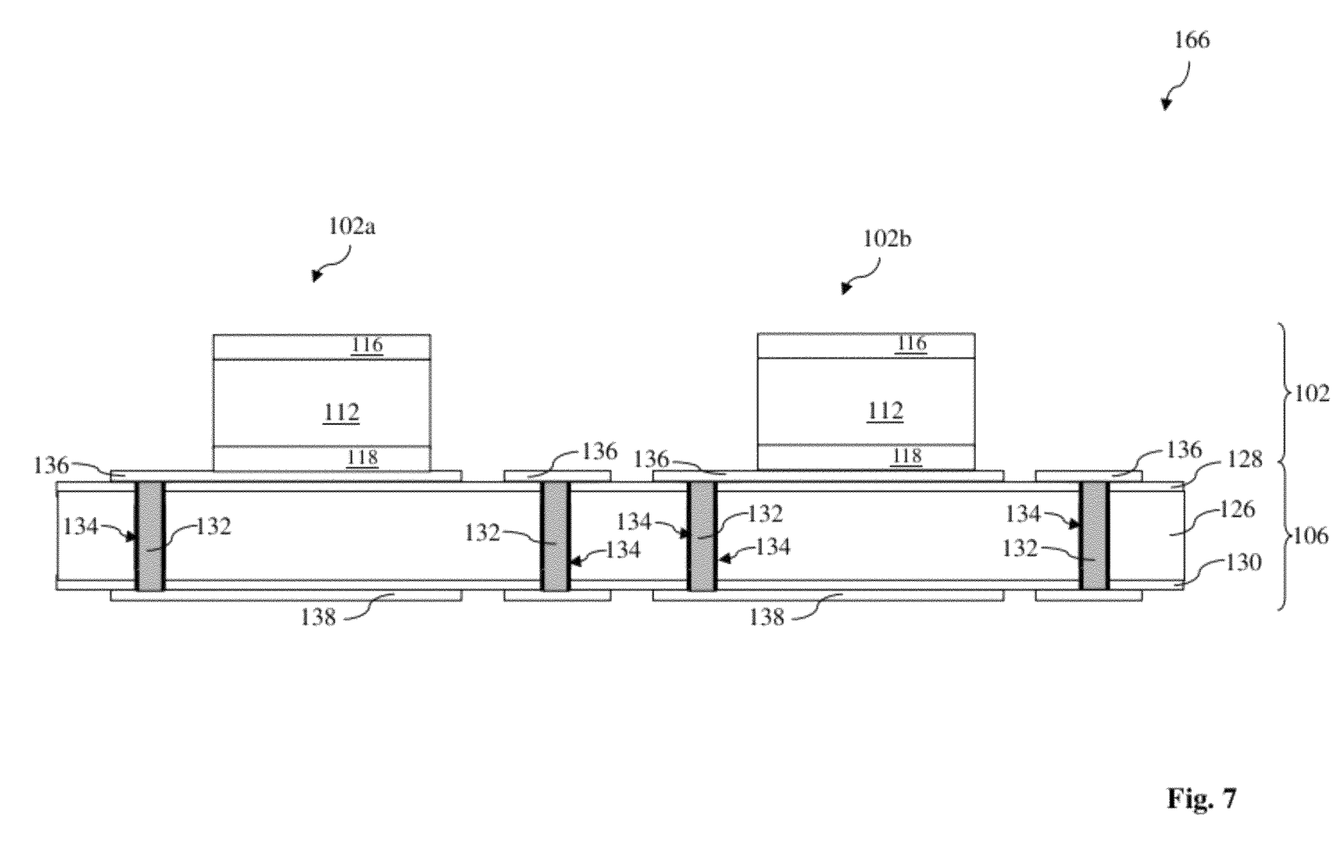
FIGS. 7-8 show cross-sectional views of another embodiment of a semiconductor structure having LED dies at various wafer-level packaging stages.
Figure 8:
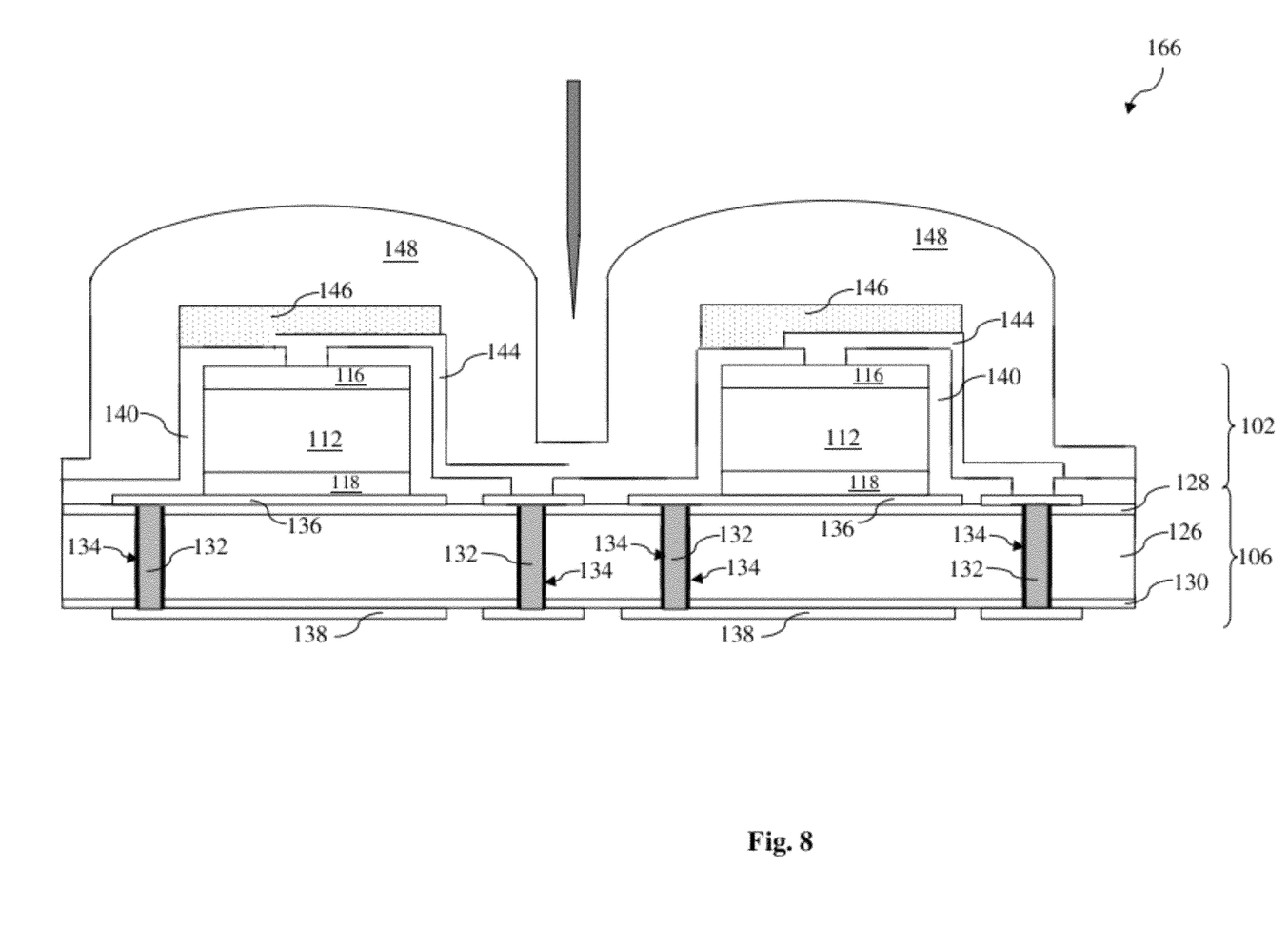

FIGS. 7 and 8 are sectional views of a semiconductor structure 166 having LED dies at various stages of wafer level packaging constructed according to aspects of the present disclosure in other embodiments. With reference to FIGS. 7 and 8, the semiconductor structure 166 and a method of making the same are collectively described.

Referring to FIG. 7, the semiconductor structure 166 is similar to the semiconductor structure 100 except for that the LED dies 102 of the semiconductor structure 166 are free of the carrier substrate. Particularly, the LED dies 102 of the semiconductor structure 166 each include a LED 112, a top electrode 116 and the bottom electrode 118. In the present embodiment, the top electrode 116 contacts the n-type doped semiconductor layer of the LED 112 and the bottom electrode 118 contacts the p-type doped semiconductor layer of the LED 112. The LED dies 102 are boned to the packaging substrate 106 through the bottom electrodes 118 and the metal features (bonding contacts) 136. The LED dies 102 can be formed by a procedure referred to as i-flow. For example, in the i-flow to form the vertical die, the epitaxial layers of the LEDs on the growth substrate are diced into separated dies after the p-contact metal layer is deposited but before the growth substrate is removed. The growth substrate is only removed after the separated dies are bonded to the packaging substrate 106. The top electrode (n-contact metal layer) 116 is deposited on the n-GaN layer of the LED 112 to form an n-contact for the LED die after removal of the growth substrate and the n-GaN layer.

Referring to FIG. 8, the subsequent process steps to form the RDLs 144 are similar to the corresponding processing steps of FIGS. 2 through 5. Specifically, an isolation layer 140 is deposited over the LED dies 102 and the packaging substrate 106. The isolation layer 140 covers the LED dies 102 and the packaging substrate 106 for isolation and passivation. In one embodiment, the isolation layer 140 includes aluminum oxide ($Al_2O_3$), silicon oxide ($SiO_2$), or other suitable dielectric material deposited in a coating or printing process.

An isolation layer 140 is patterned to form various via openings that expose the top electrode 116 and the metal features 136 for electrical routing. In one embodiment, the patterning of the isolation layer 140 includes a lithography process and etching.

An interconnect features 144 are formed on the isolation layer 140 and in the opening to contact the top electrode 116 and the metal features 136. The interconnect features 144 couple the top electrode 116 to the corresponding metal feature 138 through the respective metal feature 136 and the TSV 132. The interconnect features 144 provides conductive routing from the electrodes of the LED dies 102 to the electrodes 138 on the packaging substrate. The interconnect features 144 may be a metal layer or a transparent conductive layer such as indium tin oxide (ITO) or indium zinc oxide (IZnO).

A phosphor 146 is distributed around the LED dies 102 to change the wavelength of the emitted light. In one embodiment, the phosphor embedded in a coating material is formed on the interconnect features 144 and the isolation layer 140. Phosphor coating may be deposited using a mask or through screen printing to form a surface phosphor layer to only cover the interconnect features 144 and the isolation layer 140 on the top surface of the LED dies 102. Alternatively, phosphor coating may be deposited through a spray process to form a conformal phosphor layer to cover the interconnect features and the isolation layer on the top surface and also the side walls of the LED dies.

A lens 148 is formed on the phosphor coating with a shape to enhance light emission efficiency. The lens 148 may be formed by placing a lens molding over the LED die, injecting silicone into the lens molding, and curing the injected silicone.

The LED dies 102 along with the packaging substrate 106 are diced into individual LED packages to complete the wafer level packaging process. The separated LED packages include individual LED dies 102 bonded to the packaging substrate 106.

Although, the semiconductor structure having LED dies packaged at wafer level and the method making the same are described according various embodiments of the present disclosure, other alternative, replacement or modification may present without departure from the spirit of the present disclosure. In another embodiment, another configuration of LED dies includes a horizontal die, also known as a face-up LED. In a face-up LED (taking a GaN LED as an example), contact metallization for the p-GaN layer and the n-GaN layer are on the same side of the LEDs. In one example, the n-GaN layer and the MQW layer are patterned and etched in a photolithography process to partially expose the p-GaN layer. A metal plug is formed to contact the p-GaN layer and provide a p-contact or p-electrode. The n-electrode is also formed on the same side of the LED to connect the n-GaN layer. Furthermore, the isolation layer 140 and the interconnect features 144 are patterned accordingly to provide electrical routing for both p-contact and the n-contact to the respective metal features 138 of the packaging substrate 106.

In another embodiment, bonding the LED dies to the packaging substrate also includes forming a thermal conductive path for transferring heat away from each of the separated LED dies. In yet another embodiment, the packaging substrate 106 is removed before dicing the plurality of separated LED dies 102 into the plurality of LED packages. In yet another embodiment, each pair of metal features 136 and 138 are coupled by more than one TSVs 132. In yet another embodiment of the LED dies, the n-type doped layer and the p-type doped layer can be switched such that the top electrode contacts the p-type doped layer and the bottom electrode contacts the n-type doped layer.

Thus, the present disclosure provides a method of fabricating a light emitting diode (LED) package. The method includes bonding a plurality of separated light emitting diode (LED) dies to a substrate, wherein each of the plurality of separated LED dies includes an n-doped layer, a quantum well active layer, and a p-doped layer. The method further includes depositing an isolation layer over the plurality of separated LED dies and the substrate and etching the isolation layer to form a plurality of via openings to expose portions of each LED die and portions of the substrate. The method also includes forming electrical interconnects over the isolation layer and inside the plurality of via openings to electrically connect between one of the doped layers of each LED die and the substrate. The plurality of separated LED dies and the substrate are diced into a plurality of LED packages.

In the present embodiment, the bonding includes bonding a p-contact metal layer of one of the separated LED dies to a bonding contact disposed on the substrate, wherein the p-contact metal layer electrically connects to the p-doped layer of the separated LED die(s). The bonding electrically connects the p-doped layer of the separated LED die(s) to the bonding contact. The bonding may include bonding an electrode of one of the separated LED dies to a bonding contact disposed on the substrate. The substrate includes a plurality of through silicon vias (TSVs) each being coupled with one of the n-doped layer and the p-doped layer.

In another embodiment, the bonding includes forming a thermal conductive path for transferring heat away from one of the separated LED dies. In yet another embodiment, the bonding includes bonding a growth substrate of one of the separated LED dies to a bonding contact disposed on the substrate. The forming electrical interconnects may include depositing an interconnect layer and filling the plurality of via openings with the interconnect layer to form a plurality of electrical vias to the exposed portions of each LED die and the exposed portions of the substrate.

In another embodiment, depositing an interconnect layer includes depositing a barrier layer over the isolation layer and depositing a seed metal layer over the barrier layer. A photoresist layer is laminated over the seed metal layer and patterned to define one or more channels for one or more re-distribution lines. The channels are metal plated to form the one or more metal re-distribution lines and to fill the plurality of via openings with the metal; and removing the photoresist layer. In yet another embodiment, the depositing an interconnect layer includes depositing a transparent conductive layer over the isolation layer and to fill the plurality of via openings with the transparent conductive layer.

In another embodiment, the exposed portions of one of the separated dies include a n-contact metallization, the exposed portions of the substrate include a contact electrode disposed on the substrate, and wherein the depositing an interconnect layer comprises forming an electrical interconnect between the n-contact metallization and the contact electrode. The exposed portions of one of the separated dies include a p-contact metallization, the exposed portions of the substrate include a contact electrode disposed on the substrate, and wherein the depositing an interconnect layer comprises forming an electrical interconnect between the p-contact metalli-zation and the contact electrode. The method may further include removing a growth substrate from one of the separated LED dies after the bonding and before the depositing. The method may further include removing the substrate before the dicing the plurality of separated LED dies into the plurality of LED packages. The method may further include forming a phosphor layer and a lens over each LED die after the forming electrical interconnects and before the dicing.

The present disclosure also provides another embodiment of a method of fabricating a light emitting diode (LED) package. The method includes providing a plurality of separated LED dies, wherein each of the plurality of separated dies includes an n-doped layer, a quantum well active layer, a p-doped layer, and a p-contact metal layer on a growth substrate. The method further includes bonding the p-contact metal layer of the plurality of separated LED dies to a substrate; removing the growth substrate from the plurality of separated LED dies; and depositing an isolation layer over the plurality of separated LED dies and the substrate. The isolation layer is etched to form a plurality of via openings to expose portions of each of the plurality of separated LED dies and portions of the substrate. An interconnect layer is deposited over the isolation layer and the plurality of via openings to form electrical interconnects between the n-doped layer of each of the plurality of separated LED dies and the substrate. The method further includes forming a phosphor layer and a lens over each of the plurality of separated LED dies; and dicing the plurality of separated LED dies and the substrate into a plurality of LED packages.

In the present embodiment, the bonding electrically connects the p-doped layer of the plurality of separated dies to the substrate. The etching the isolation layer includes forming a plurality of via openings to expose the n-doped layer of the plurality of separated dies. The depositing an interconnect layer may include metal plating with a metal layer to fill the plurality of via openings and to form an electrical interconnection between the n-doped layer and an electrode on the substrate. The depositing an interconnect layer may include depositing a transparent conductive layer over the isolation layer and to fill the plurality of via openings to form an electrical interconnection between the n-doped layer and an electrode on the substrate.

The present disclosure also provides an embodiment of a semiconductor structure. The semiconductor structure includes a substrate including a bonding contact and an electrode; an LED die bonded to the substrate through the bonding contact; an isolation layer disposed over the LED die and the substrate, wherein the isolation layer includes a plurality of via openings to expose portions of the LED die and the electrode of the substrate; and an interconnect layer deposited over the isolation layer and the plurality of via openings to electrically connect the LED die to the electrode of the substrate. In the present embodiment, the bonding contact and the electrode are configured to electrically coupled through a through silicon via (TSV) embedded in the substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a plurality of light emitting diode (LED) packages, comprising:
   bonding a plurality of separated LED dies to a substrate, wherein each of the plurality of separated LED dies includes an n-doped layer, a quantum well active layer, and a p-doped layer;
   depositing an isolation layer conformally over the plurality of separated LED dies and the substrate;
   etching the isolation layer to form a plurality of via openings to expose portions of each LED die and portions of the substrate;
   forming electrical interconnects over the isolation layer and inside the plurality of via openings to electrically connect between one of the doped layers of each LED die and the substrate, wherein the etching and the forming the electrical interconnects are performed such that:
      the exposed portions of one of the separated dies include a contact metallization;
      the exposed portions of the substrate include a contact electrode disposed on the substrate; and
      the contact metallization and the contact electrode are electrical interconnected; and
   dicing the plurality of separated LED dies and the substrate into a plurality of LED packages.

2. The method of claim 1, wherein the bonding comprises bonding an electrode of one of the separated LED dies to a bonding contact disposed on the substrate.

3. The method of claim 1, wherein the substrate comprises a plurality of through silicon vias (TSVs), each of the plurality of TSVs being coupled with one of the n-doped layer and the p-doped layer, and wherein a subset of the plurality of TSVs are aligned with a subset of the via openings, respectively.

4. The method of claim 1, wherein the bonding comprises forming a thermal conductive path for transferring heat away from one of the separated LED dies.

5. The method of claim 1, wherein the bonding comprises bonding a carrier substrate of one of the separated LED dies to a bonding contact disposed on the substrate.

6. The method of claim 1, wherein the forming electrical interconnects comprises depositing an interconnect layer and filling the plurality of via openings with the interconnect layer to form a plurality of electrical vias to the exposed portions of each LED die and the exposed portions of the substrate.

7. The method of claim 6, wherein the depositing an interconnect layer comprises depositing a transparent conductive layer over the isolation layer and to fill the plurality of via openings with the transparent conductive layer.

8. The method of claim 1, further comprising forming a phosphor layer and a lens over each LED die after the forming electrical interconnects and before the dicing.

9. The method of claim 1, wherein the depositing the isolation layer is performed so that the isolation layer has a uniform thickness.

10. A method of fabricating a plurality of light emitting diode (LED) packages, comprising:
    providing a plurality of separated LED dies, wherein each of the plurality of separated dies includes an n-doped layer, a quantum well active layer, a p-doped layer, and a p-contact metal layer on a carrier substrate;
    bonding the carrier substrate of the plurality of separated LED dies to a packaging substrate, the packaging substrate including a through silicon via (TSV);
    depositing an isolation layer over the plurality of separated LED dies and the packaging substrate;
    etching the isolation layer to form a plurality of via openings to expose portions of each of the plurality of separated LED dies and portions of the packaging substrate, wherein at least one of the plurality of via openings is aligned with the TSV;
    depositing an interconnect layer over the isolation layer and the plurality of via openings to form electrical interconnects between the n-doped layer of each of the plurality of separated LED dies and the packaging substrate;
    forming a phosphor layer and a lens over each of the plurality of separated LED dies; and
    dicing the plurality of separated LED dies and the packaging substrate into a plurality of LED packages.

11. The method of claim 10, wherein the bonding electrically connects the p-doped layer of the plurality of separated dies to the packaging substrate.

12. The method of claim 10, wherein the etching the isolation layer comprises forming a plurality of via openings to expose the n-doped layer of the plurality of separated dies.

13. The method of claim 10, wherein the depositing an interconnect layer comprises metal plating with a metal layer to fill the plurality of via openings and to form an electrical interconnection between the n-doped layer and an electrode on the packaging substrate.

14. The method of claim 10, wherein the depositing an interconnect layer comprises depositing a transparent conductive layer over the isolation layer and to fill the plurality of via openings to form an electrical interconnection between the n-doped layer and an electrode on the packaging substrate.

15. The method of claim 10, wherein the depositing the isolation layer is performed such that the isolation layer is deposited conformally over the plurality of separated LED dies.

16. A method, comprising:
    providing a packaging substrate, the packaging substrate having a first side and a second side opposite the first side, wherein the packaging substrate includes a first pad and a second pad disposed over the first side and a third pad and a fourth pad disposed over the second side, and wherein the packaging substrate includes a first through silicon via (TSV) and a second TSV each extending from the first side to the second side, the first TSV electrically coupling the first pad to the third pad, and the second TSV electrically coupling the second pad to the fourth pad;
    bonding a light-emitting diode (LED) die to the first pad, the LED die including an n-doped layer, a quantum well active layer, and a p-doped layer;
    forming an isolation layer over the LED die and over the packaging substrate;
    etching the isolation layer to form a first opening and a second opening in the isolation layer, the first opening exposing a portion of the LED die, the second opening exposing the second pad; and
    depositing a conductive layer over the isolation layer, the conductive layer filling the first opening and the second opening, thereby electrically interconnecting the LED die and the second TSV.

17. The method of claim 16, wherein the forming the isolation layer is performed so that the isolation layer is formed conformally.

18. The method of claim 16, further comprising:
    forming a phosphor layer and a lens over the LED die; and
    thereafter dicing the packaging substrate.

* * * * *